US008232887B2

(12) United States Patent
Baer et al.

(10) Patent No.: US 8,232,887 B2
(45) Date of Patent: Jul. 31, 2012

(54) ELECTRONIC MONITORING OF THE ON-BOARD POWER SUPPLY SYSTEM OF A MOTOR VEHICLE WITH RESPECT TO VOLTAGE PEAKS OR VOLTAGE DROPS

(75) Inventors: Mathias Baer, Kirchberg (DE); Robert Kellner, Munich (DE); Rainer Drees, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 12/466,783

(22) Filed: May 15, 2009

(65) Prior Publication Data

US 2009/0278525 A1    Nov. 12, 2009

Related U.S. Application Data

(63) Continuation of application No. PCT/EP2007/009748, filed on Nov. 10, 2007.

(30) Foreign Application Priority Data

Nov. 16, 2006    (DE) .................. 10 2006 054 016

(51) Int. Cl.
*G08B 3/00* (2006.01)
(52) U.S. Cl. ........ 340/661; 340/662; 340/663; 340/664; 702/64; 702/57; 702/198; 701/36
(58) Field of Classification Search ........... 340/660–664
See application file for complete search history.

(56) References Cited

U.S. PATENT DOCUMENTS

| 3,813,667 A | 5/1974 | Smith |
| 5,790,039 A * | 8/1998 | Palara et al. .................. 340/662 |
| 6,087,793 A | 7/2000 | Preis |
| 6,360,177 B1 * | 3/2002 | Curt et al. ....................... 702/64 |
| 2006/0052922 A1* | 3/2006 | Koenig et al. ................... 701/36 |
| 2007/0120694 A1* | 5/2007 | Lindsey et al. ............... 340/662 |
| 2008/0034260 A1 | 2/2008 | Wanner et al. |

FOREIGN PATENT DOCUMENTS

| DE | 197 32 095 A1 | 1/1999 |
| DE | 102 19 824 A1 | 11/2003 |
| EP | 0 390 680 A1 | 10/1990 |
| WO | WO 2006/061033 A1 | 6/2006 |

OTHER PUBLICATIONS

International Search Report dated Apr. 1, 2008 w/English translation (four (4) pages).
German Search Report dated Aug. 8, 2007 w/English translation of relevant portions (nine (9) pages).

* cited by examiner

*Primary Examiner* — George Bugg
*Assistant Examiner* — Ojiako Nwugo
(74) *Attorney, Agent, or Firm* — Crowell & Moring LLP

(57) ABSTRACT

A process is provided for the electronic monitoring of the on-board power supply system, or parts of the on-board power supply system, of a motor vehicle with respect to voltage peaks or voltage drops. The value of the electric voltage is continuously recorded, and a comparator circuit continuously compares a first earlier voltage value with a subsequently determined second voltage value. The comparator circuit keeps available for a predetermined time period the highest voltage value recorded up to that point-in-time.

10 Claims, 1 Drawing Sheet

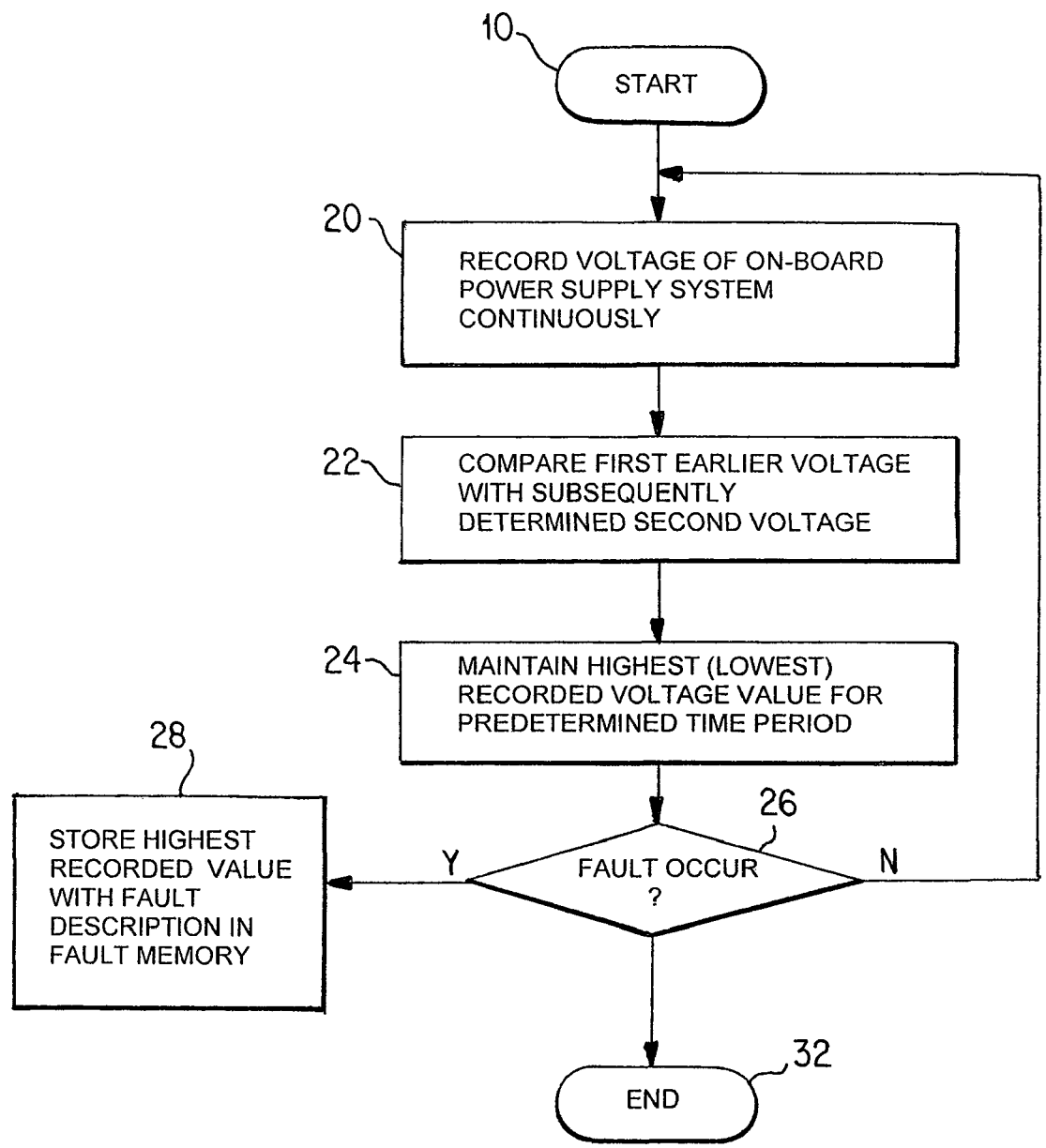

ELECTRONIC MONITORING OF THE ON-BOARD POWER SUPPLY SYSTEM OF A MOTOR VEHICLE WITH RESPECT TO VOLTAGE PEAKS OR VOLTAGE DROPS

CROSS-REFERENCE TO RELATED APPLICATIONS

This application is a continuation of PCT International Application No. PCT/EP2007/009748, filed Nov. 10, 2007, which claims priority under 35 U.S.C. §119 to German Patent Application No. DE 10 2006 054 016.6, filed Nov. 16, 2006, the entire disclosures of which are herein expressly incorporated by reference.

BACKGROUND AND SUMMARY OF THE INVENTION

The invention relates to a process for the electronic monitoring of the on-board power supply system, or parts of the on-board power supply system, of a motor vehicle with respect to voltage peaks and/or voltage drops.

Voltage peaks or voltage drops in the on-board power supply system of a motor vehicle having numerous control devices may result in faults in the operating mode of the on-board power supply system that are erroneously attributed to one or more control devices. Voltage peaks or voltage drops can be detected using oscilloscopes or the like and their extent can be determined only in the repair shop and not under real operating conditions of the motor vehicle. This applies particularly when brief and/or irregularly occurring peaks or drops are involved.

It is particularly an object of the invention to provide a process and a system by which voltage peaks or voltage drops in the on-board power supply system of a motor vehicle can be recognized in a cost-effective manner.

This object is in each case achieved by a process and system for the electronic monitoring of the on-board power supply system, or parts of the on-board power supply system, of a motor vehicle with respect to voltage peaks or voltage drops, wherein the value of the electric voltage is continuously recorded, and a comparator circuit continuously compares a first earlier voltage value with a subsequently determined second voltage value, and further wherein the comparator circuit keeps available for a predetermined time period the highest voltage value recorded up to that point-in-time. Advantageous embodiments of the invention are described herein.

Other objects, advantages and novel features of the present invention will become apparent from the following detailed description of one or more preferred embodiments when considered in conjunction with the accompanying drawings.

BRIEF DESCRIPTION OF THE DRAWING

FIG. 1 is a flow chart illustrating the process for electronic monitoring of the on-board power supply system according to an embodiment of the present invention.

DETAILED DESCRIPTION OF THE DRAWING

Referring to FIG. 1, a process for the electronic monitoring of the on-board power supply system, or of parts of the power supply system, of a motor vehicle with respect to voltage peaks or voltage drops is provided. After starting the process (10), the value of the electric voltage is continuously recorded (20), and a comparator circuit continuously compares a first earlier voltage value with a subsequently determined second voltage value (22). The comparator circuit keeps available for a predetermined time period the highest voltage value recorded up to that point (24). A comparator circuit of this type can be implemented in a cost-effective manner. In addition, reasonably priced comparators are capable of recognizing very brief "peaks" with a total duration in the range of, for example, 10 µs and of recording their maximal or peak voltage. A high-expenditure recording system having a correspondingly high sampling rate for the recording of such brief pulses or peaks can be avoided by means of the process according to the invention.

It is further provided that, in the event a fault occurs (26) in the on-board power supply system or in a control device arranged in the on-board power supply system, the highest voltage value recorded up to that point is stored in a fault memory together with a description of the fault (28). This clearly facilitates the search for the fault, or avoids that a control device is, for example, erroneously blamed for a fault.

In another embodiment of the invention, the electric voltage of the primary and/or secondary side of the ignition voltage circuit of the motor vehicle is continuously monitored, as required, after a reduction of the measuring voltage by way of a voltage divider. As a result, it can be determined in a cost-effective manner whether the ignition voltage circuit provides the required ignition voltage for the concerned operating conditions of an internal-combustion engine of the motor vehicle.

In yet another embodiment of the invention, it is provided that the comparator circuit compares the highest voltage value recorded so far with a predetermined threshold value, and the highest voltage value recorded so far is stored by the comparator circuit when the predetermined threshold value is exceeded. This documents the occurrence of significant voltage bounces.

In still another embodiment of the invention, the comparator circuit provides the highest voltage value recorded so far with a time stamp and stores it. By documenting the point in time of the occurrence of the voltage bounce, the assignment of voltage bounces to faults occurring in the on-board power supply system or in control devices of the power supply system is facilitated.

In addition, the process according to the invention permits the providing of an advantageous system for the electronic monitoring of the on-board power supply system, or of parts of the on-board power supply system, of a motor vehicle with respect to voltage peaks or voltage drops, as well as of a corresponding on-board power supply system.

Although the highest voltage value or a voltage peak is mentioned above, the above should analogously also apply to the lowest voltage value or to voltage drops within the scope of additional not explicitly described embodiments. In these cases, the comparison is then made with a lower threshold value.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A process for electronic monitoring of an on-board power supply system, or parts of the on-board power supply system, of a motor vehicle with respect to voltage peaks or voltage drops, the process comprising the acts of:

recording continuously, during normal operating conditions, electric voltage values of a primary and/or secondary side of an ignition voltage circuit of the motor vehicle after reducing a measuring voltage by way of a voltage divider;

comparing an earlier recorded voltage value with a subsequently recorded second voltage value using a comparator circuit;

maintaining, in the comparator circuit and for up to a predetermined time period, a highest voltage value and a time stamp of said highest voltage value, of the continuously-recorded electric voltage values, recorded up to that point-in-time; and determining whether a fault occurred in one of the on-board power supply system and a control unit operatively coupled to the on-board power supply system; and in response to determining that a fault occurred, recording from the comparator circuit into a fault memory, the then-highest voltage value being maintained by the comparator circuit, together with a description of the fault.

2. The process according to claim 1, further comprising the acts of:

comparing with the comparator circuit the highest voltage value recorded up to that point-in-time with a predetermined threshold value; and storing the highest voltage value recorded up to that point-in-time only when the predetermined threshold value is exceeded.

3. The process according to claim 1, further comprising the acts of: comparing with the comparator circuit the highest voltage value recorded up to that point-in-time with a predetermined threshold value; and storing the highest voltage value recorded up to that point-in-time only when the predetermined threshold value is exceeded.

4. The process according to claim 1, wherein the description of the fault includes information relating to a cause of the fault.

5. An electronic monitoring system of a motor vehicle, the system comprising:

an on-board power supply system of the motor vehicle;

a recordation unit that records continuously, during normal operating conditions, an electric voltage value of a primary and/or secondary side of an ignition voltage circuit of the motor vehicle after reducing a measuring voltage by way of a voltage divider;

a comparator circuit that compares a first earlier recorded voltage value with a subsequently recorded second voltage value, said comparator circuit storing for up to a predetermined time period a highest voltage value recorded of the continuously-recorded electric voltage values and a time stamp of said highest voltage value; and a fault memory for storing, in response to the occurrence of a fault, the then-highest voltage value being stored by the comparator circuit, together with a description of the fault.

6. The electronic monitoring system of claim 5, wherein the description of the fault includes information relating to a cause of the fault.

7. The electronic monitoring system of claim 5, wherein the comparator circuit is further configured to compare a highest voltage value recorded up to that point-in-time with a predetermined threshold value, and wherein the fault memory is further configured to store the highest voltage value recorded up to that point-in-time only when the predetermined threshold value is exceeded.

8. An on-board power supply system of a motor vehicle, comprising:

an electronic monitoring system operatively coupled with the on-board power supply system for monitoring voltage peaks or voltage drops in the on-board power supply system, the electronic monitoring system comprising:

a recordation unit that records continuously, during normal operating conditions, an electric voltage value of a primary and/or secondary side of an ignition voltage circuit of the motor vehicle after reducing a measuring voltage by way of a voltage divider;

a comparator circuit that compares a first earlier recorded voltage value with a subsequently recorded second voltage value, said comparator circuit storing for up to a predetermined time period a highest voltage value recorded of the continuously-recorded electric voltage values and a time stamp of said highest voltage value; and a fault memory for storing, in response to the occurrence of a fault, the then-highest voltage value being stored by the comparator circuit, together with a description of the fault.

9. The on-board power supply system of claim 8, wherein the description of the fault includes information relating to a cause of the fault.

10. The on-board power supply system of claim 8, wherein the comparator circuit of the electronic monitoring system is further configured to compare a highest voltage value recorded up to that point-in-time with a predetermined threshold value, and wherein the fault memory is further configured to store the highest voltage value recorded up to that point-in-time only when the predetermined threshold value is exceeded.

* * * * *